US012237250B2

United States Patent
Kim et al.

(10) Patent No.: US 12,237,250 B2
(45) Date of Patent: Feb. 25, 2025

(54) SEMICONDUCTOR PACKAGE

(71) Applicant: Samsung Electronics Co., Ltd., Suwon-si (KR)

(72) Inventors: Dongkyu Kim, Anyang-si (KR); Minjung Kim, Cheonan-si (KR); Kyounglim Suk, Suwon-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 606 days.

(21) Appl. No.: 17/498,893

(22) Filed: Oct. 12, 2021

(65) Prior Publication Data
US 2022/0302002 A1 Sep. 22, 2022

(30) Foreign Application Priority Data
Mar. 22, 2021 (KR) .................. 10-2021-0036448

(51) Int. Cl.
*H01L 23/498* (2006.01)
*H01L 23/00* (2006.01)
(Continued)

(52) U.S. Cl.
CPC ...... *H01L 23/49816* (2013.01); *H01L 23/293* (2013.01); *H01L 23/49822* (2013.01); *H01L 23/49838* (2013.01); *H01L 23/5383* (2013.01); *H01L 23/5386* (2013.01); *H01L 24/16* (2013.01); *H01L 24/32* (2013.01); *H01L 24/73* (2013.01); *H01L 25/0655* (2013.01); *H01L 24/48* (2013.01); *H01L 24/49* (2013.01);
(Continued)

(58) Field of Classification Search
CPC ............ H01L 23/49816; H01L 23/293; H01L 23/49822; H01L 23/49827
See application file for complete search history.

(56) References Cited

U.S. PATENT DOCUMENTS 9,831,219 B2 11/2017 Chuang et al.
9,842,825 B2 12/2017 Huang et al.
(Continued)

FOREIGN PATENT DOCUMENTS

KR 10-2005-0053476 A 6/2005
KR 10-2014-0050507 A 4/2014
(Continued)

*Primary Examiner* — Errol V Fernandes
(74) *Attorney, Agent, or Firm* — Muir Patent Law, PLLC

(57) ABSTRACT

A semiconductor package includes a redistribution substrate having first and second surfaces opposing one another, a first semiconductor chip on the first surface of the redistribution substrate, a passive device and a metal post on the second surface of the redistribution substrate and electrically connected to the redistribution pattern, a second encapsulant encapsulating at least side surfaces of the passive device and the metal post, a second insulating layer on a lower surface of the metal post and a lower surface of the second encapsulant, and having an opening exposing at least a portion of the lower surface of the metal post, and a connection bump filling the opening of the second insulating layer and in direct contact with the lower surface of the exposed metal post, wherein the metal post has a height greater than a height of each of the redistribution pattern and the redistribution via.

20 Claims, 10 Drawing Sheets

(51) Int. Cl.
    *H01L 23/29*       (2006.01)
    *H01L 23/538*     (2006.01)
    *H01L 25/065*     (2023.01)
    *H01L 25/10*       (2006.01)

(52) U.S. Cl.
    CPC ........ *H01L 25/0657* (2013.01); *H01L 25/105* (2013.01); *H01L 2224/16235* (2013.01); *H01L 2224/32225* (2013.01); *H01L 2224/48145* (2013.01); *H01L 2224/48227* (2013.01); *H01L 2224/49109* (2013.01); *H01L 2224/73204* (2013.01)

(56) References Cited

U.S. PATENT DOCUMENTS

| | | |
|---|---|---|
| 10,163,867 B2 | 12/2018 | Kim et al. |
| 10,269,586 B2 | 4/2019 | Chou et al. |
| 10,461,036 B2 * | 10/2019 | Yu ......................... H01L 21/568 |
| 10,475,747 B2 | 11/2019 | Yu et al. |
| 2007/0059866 A1 | 3/2007 | Yang et al. |
| 2014/0110856 A1 | 4/2014 | Lin |
| 2016/0233196 A1 | 8/2016 | Kim et al. |
| 2017/0103951 A1 | 4/2017 | Lee et al. |
| 2019/0115300 A1 * | 4/2019 | Yu ......................... H01L 24/06 |
| 2020/0118913 A1 | 4/2020 | Matsukawa et al. |

FOREIGN PATENT DOCUMENTS

| | | |
|---|---|---|
| KR | 10-1672622 B1 | 11/2016 |
| KR | 10-2017-0043440 A | 4/2017 |

\* cited by examiner

I-I'

SEMICONDUCTOR PACKAGE

CROSS-REFERENCE TO RELATED APPLICATION(S)

This application claims benefit of priority under 35 U.S.C. § 119 to Korean Patent Application No. 10-2021-0036448, filed on Mar. 22, 2021, in the Korean Intellectual Property Office, the disclosure of which is incorporated herein by reference in its entirety.

BACKGROUND

Example embodiments of the present disclosure relate to a semiconductor package.

A semiconductor package may be mounted on a substrate (e.g., a main board) via various types of connection bumps. Connection reliability between the semiconductor package and the substrate may be affected by a connection state between the connection bump and a redistribution layer of the semiconductor package. To enhance board level reliability of a semiconductor package, an under-bump metal (UBM) structure may be formed between a redistribution layer and a connection bump (e.g., a solder bump).

SUMMARY

An example embodiment of the present disclosure is to provide a semiconductor package having improved reliability.

According to an example embodiment of the present disclosure, a semiconductor package includes a redistribution substrate having a first surface and a second surface opposite the first surface, and including a first insulating layer, a redistribution pattern disposed on the first insulating layer, and a redistribution via penetrating the first insulating layer and electrically connected to the redistribution pattern, a first semiconductor chip disposed on the first surface of the redistribution substrate and electrically connected to the redistribution pattern, a first encapsulant disposed on the first surface of the redistribution substrate and encapsulating at least a portion of the first semiconductor chip, a passive device and a metal post disposed on the second surface of the redistribution substrate and electrically connected to the redistribution pattern, a second encapsulant disposed on the second surface of the redistribution substrate and encapsulating at least side surfaces of the passive device and the metal post, a second insulating layer disposed on a lower surface of the metal post and a lower surface of the second encapsulant, and having an opening exposing at least a portion of the lower surface of the metal post, and a connection bump filling the opening of the second insulating layer and in direct contact with the lower surface of the exposed metal post, wherein the metal post has a height greater than a height of each of the redistribution pattern and the redistribution via.

According to an example embodiment of the present disclosure, a semiconductor package includes a redistribution substrate having a first surface and a second surface opposite the first surface, and including a plurality of first insulating layers, a plurality of redistribution patterns disposed on the plurality of first insulating layers, and a plurality of redistribution vias penetrating the plurality of first insulating layers and electrically connected to the plurality of redistribution patterns, a first semiconductor chip and a plurality of second semiconductor chips disposed on the first surface of the redistribution substrate and electrically connected to the plurality of redistribution patterns through the plurality of redistribution vias, at least one passive device disposed on the second surface of the redistribution substrate to overlap the first semiconductor chip and at least a portion of the plurality of second semiconductor chips in a vertical direction and electrically connected to the plurality of redistribution patterns, a plurality of metal posts disposed on the second surface of the redistribution substrate and electrically connected to the plurality of redistribution patterns through the plurality of redistribution vias, an encapsulant disposed on the second surface of the redistribution substrate and encapsulating side surfaces of the plurality of metal posts and the at least one passive device, and a plurality of connection bumps, each of the plurality of connection bumps in direct contact with a lower surface of a corresponding one of the plurality of metal posts, wherein the plurality of redistribution vias include a first redistribution via adjacent to the first surface, a second redistribution via adjacent to the second surface, and a third redistribution via disposed on a level between the first and second redistribution vias, and wherein a maximum width of the first redistribution via in a horizontal direction is greater than at least one of a maximum width of the second redistribution via and a maximum width of the third redistribution via in the horizontal direction.

According to an example embodiment of the present disclosure, a semiconductor package includes a redistribution substrate having a first surface and a second surface opposite the first surface, and including a plurality of first insulating layers, a plurality of redistribution patterns disposed on the plurality of first insulating layers, and a plurality of redistribution vias penetrating the plurality of first insulating layers and electrically connected to the plurality of redistribution patterns, a first semiconductor chip disposed on the first surface of the redistribution substrate and electrically connected to the plurality of redistribution patterns through the plurality of redistribution vias, a plurality of metal posts disposed on the second surface of the redistribution substrate and electrically connected to the plurality of redistribution patterns through the plurality of redistribution vias, an encapsulant disposed on the second surface of the redistribution substrate and encapsulating a side surface of each of the plurality of metal posts, and a plurality of connection bumps disposed directly on a lower surface of each of the plurality of metal posts, wherein the plurality of redistribution vias include an upper redistribution via connecting a first redistribution pattern, disposed on an uppermost layer among the plurality of redistribution patterns, to the first semiconductor chip, and a lower redistribution via connecting the first redistribution pattern to a second redistribution pattern disposed below the first redistribution pattern, and wherein a maximum width of the upper redistribution via in a horizontal direction is greater than a maximum width of the lower redistribution via in the horizontal direction.

BRIEF DESCRIPTION OF DRAWINGS

The above and other aspects, features, and advantages of the present disclosure will be more clearly understood from the following detailed description, taken in conjunction with the accompanying drawings, in which like numerals refer to like elements throughout. In the drawings.

DETAILED DESCRIPTION

Hereinafter, embodiments of the present disclosure will be described as follows with reference to the accompanying drawings. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention.

Figure 1A:
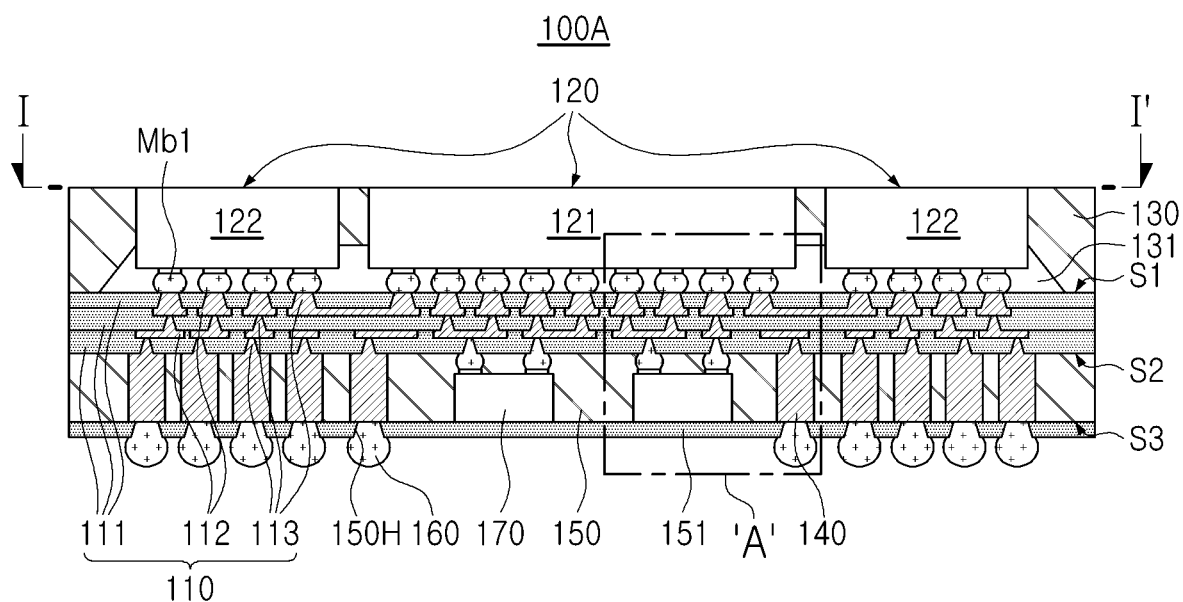
FIG. 1A is a cross-sectional diagram illustrating a semiconductor package, according to an example embodiment of the present disclosure.
Figure 1B:
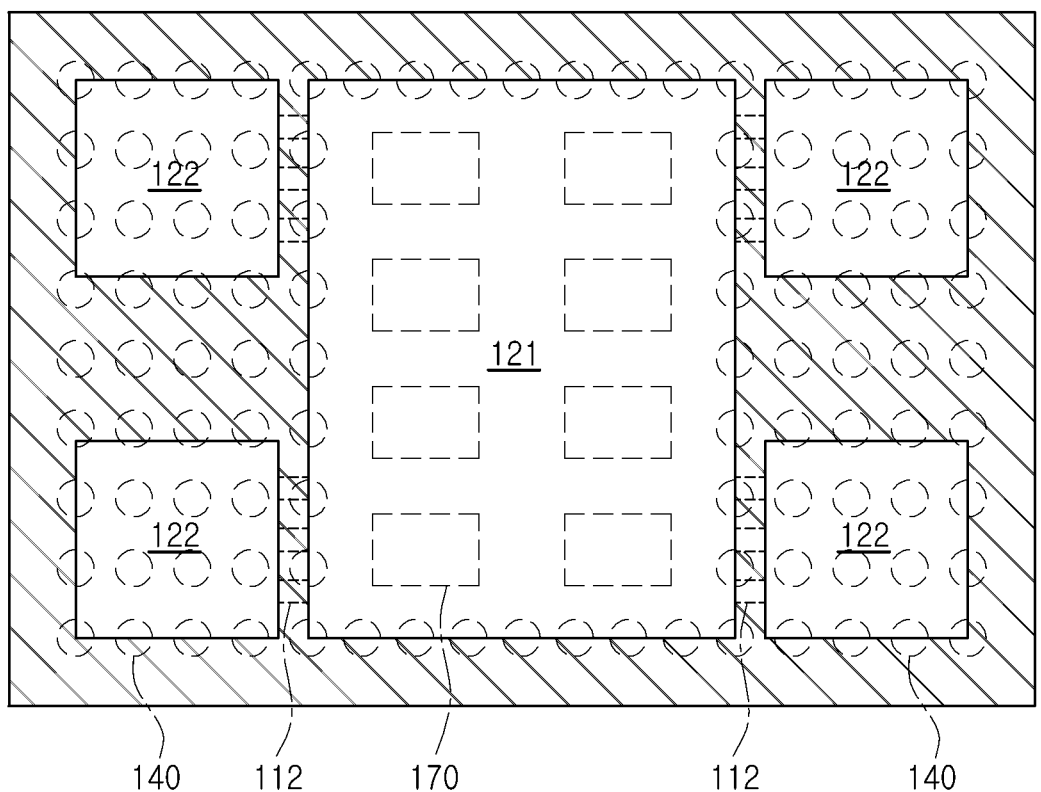
FIG. 1B is a plan diagram illustrating the semiconductor package illustrated in FIG. 1A taken along line I-I'.
Figure 2:
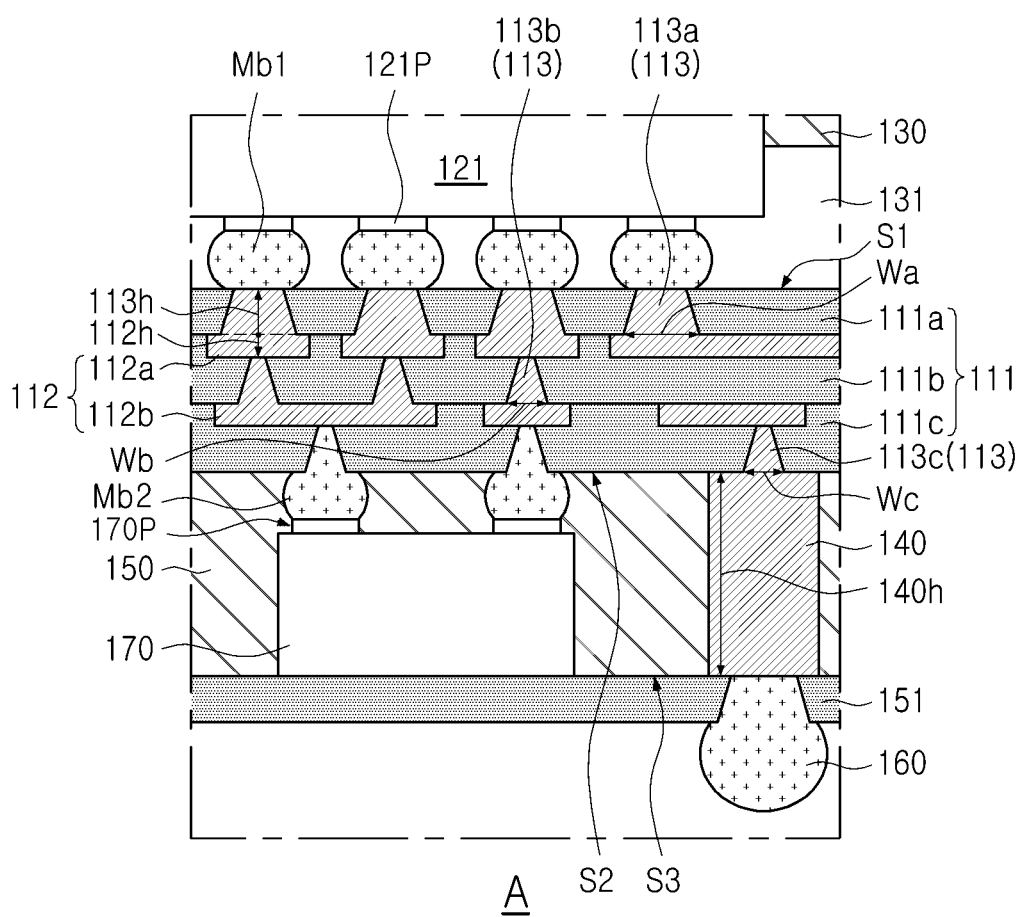
FIG. 2 is an enlarged cross-sectional diagram illustrating region "A" in FIG. 1A.
Figure 3:
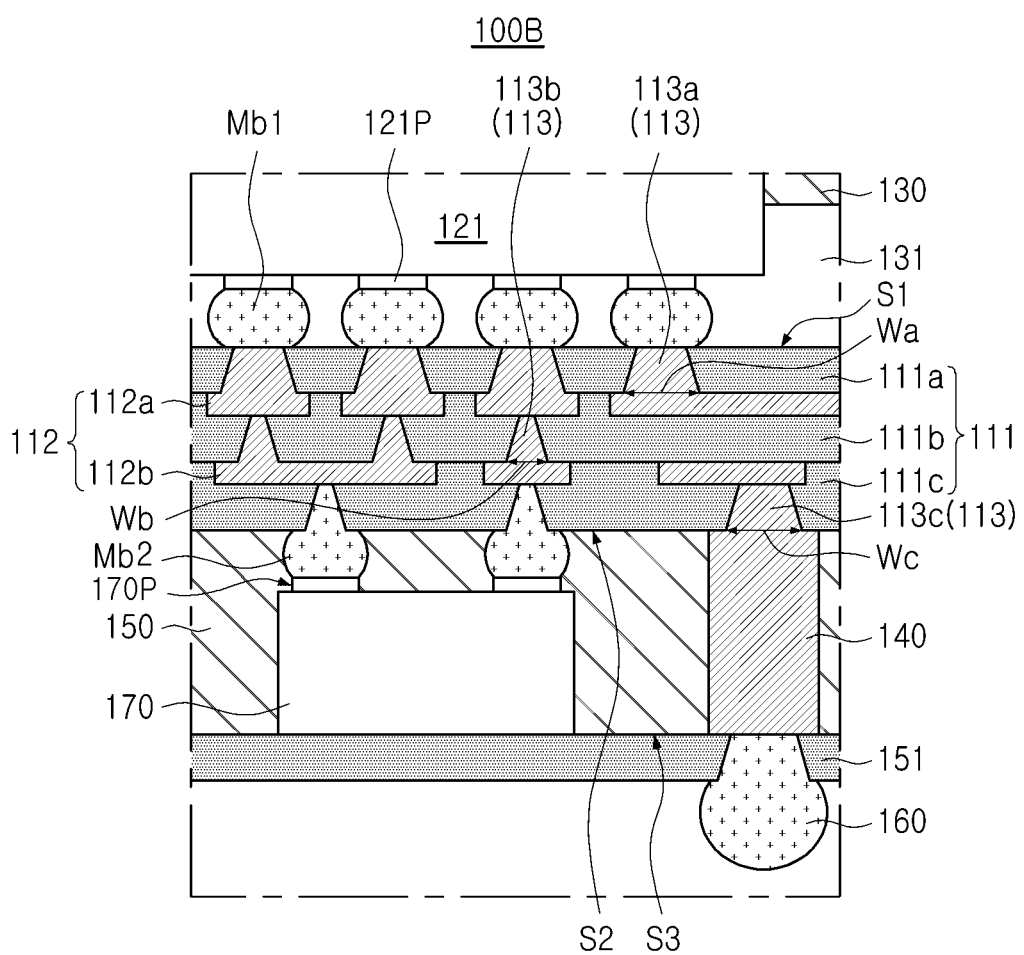
FIG. 3 is an enlarged cross-sectional diagram illustrating a portion of a semiconductor package, according to an example embodiment of the present disclosure.

FIG. 1A is a cross-sectional diagram illustrating a semiconductor package 100A according to an example embodiment. FIG. 1B is a plan diagram illustrating the semiconductor package 100A in FIG. 1A taken along line I-I'. FIG. 2 is an enlarged cross-sectional diagram illustrating region "A" in FIG. 1A. FIG. 3 illustrates a portion of the elements illustrated in FIG. 1A.

Referring to FIGS. 1A to 2, the semiconductor package 100A may include a redistribution substrate 110, at least one semiconductor chip 120, a first encapsulant 130, a metal post 140, a second encapsulant 150, and a connection bump 160. The at least one semiconductor chip 120 may include a first semiconductor chip 121 and second semiconductor chips 122. Also, the semiconductor package 100A may further include at least one passive device 170 and/or a second insulating layer 151.

The redistribution substrate 110 may have a first surface S1 and a second surface S2 opposite the first surface S1, and may include at least one first insulating layer 111, at least one redistribution pattern 112 disposed on the insulating layer 111, and at least one redistribution via 113 penetrating the first insulating layer 111 and electrically connected to the redistribution pattern 112. The first surface S1 and the second surface S2 may be parallel to one another and may face away from one another. For example, the first and second surfaces S1 and S2 may be on opposite sides of the redistribution substrate 110.

The first insulating layer 111 may include an insulating resin. The insulating resin may include a thermosetting resin such as an epoxy resin, a thermoplastic resin such as a polyimide resin, a resin in which an inorganic filler and/or a glass fiber (or a glass cloth or a glass fabric) is impregnated in the above resin, such as prepreg, Ajinomoto build-up film (ABF), FR-4, bismaleimide triazine (BT), or the like. The first insulating layer 111 may include a photosensitive resin such as a photoimageable dielectric (PID) resin. In this case, the first insulating layer 111 may have a reduced thickness, and fine redistribution patterns 112 and redistribution vias 113 may be formed. The first insulating layer 111 may include a plurality of first insulating layers 111 stacked in a vertical direction. For example, the first insulating layer 111 may include a first upper insulating layer 111a, a first intermediate insulating layer 111b, and a first lower insulating layer 111c. Depending on processes, a boundary between the insulating layers 111a, 111b, and 111c on different levels may be indistinct. Also, for ease of description, only the three insulating layers 111a, 111b, and 111c are illustrated in the drawings, but an example embodiment thereof is not limited thereto. For example, in example embodiments, the redistribution substrate 110 may include two or more first intermediate insulating layers 111b and a corresponding number of lower redistribution patterns 112b and lower redistribution vias 113b.

The redistribution patterns 112 may include a metal material including copper (Cu), aluminum (Al), silver (Ag), tin (Sn), gold (Au), nickel (Ni), lead (Pb), titanium (Ti) or alloys thereof, for example. The redistribution patterns 112 may include, for example, a ground (GrouND: GND) pattern, a power (PoWeR: PWR) pattern, and a signal (S) pattern. The signal (S) pattern may provide a path through which various signals other than a ground (GND) pattern and a power (PWR) pattern, such as a data signal, for example, are transmitted/received.

The redistribution patterns 112 may include a plurality of redistribution patterns 112a and 112b disposed on different levels, disposed on the insulating layer 111. For example, the redistribution pattern 112 may include upper redistribution patterns 112a on the first upper insulating layer 111a and lower redistribution patterns 112b on the first intermediate insulating layer 111b. The plurality of redistribution patterns 112a and 112b may be electrically connected to each other through the redistribution vias 113. In an example embodiment, the redistribution vias 113 rather than the redistribution pattern 112 may be disposed on an uppermost portion of the redistribution substrate 110. For example, the first upper insulating layer 111a may be formed on an upper surface of the uppermost redistribution patterns 112a, and the uppermost redistribution patterns 112a may be electrically connected to the first and second semiconductor chips 121 and 122 through the upper redistribution vias 113a penetrating the first upper insulating layer 111a.

Similarly to the redistribution patterns 112, the redistribution vias 113 may include a signal via, a ground via, and a power via. The redistribution vias 113 may include a metal material including copper (Cu), aluminum (Al), silver (Ag), tin (Sn), gold (Au), nickel (Ni), lead (Pb), or titanium (Ti), or alloys thereof, for example. The redistribution vias 113 may be configured as a filled via in which a metal material is filled in the via hole or a conformal via in which a metal material is formed along an internal wall of the via hole. The redistribution vias 113 may penetrate the insulating layer 111 and may electrically connect the redistribution patterns 112 to the first and second semiconductor chips 121 and 122 and the metal posts 140. For example, the plurality of redistribution vias 113 disposed on different levels may include upper redistribution vias 113a connecting the uppermost redistribution patterns 112a to the first and second semiconductor chips 121 and 122, and lower redistribution vias 113b connecting the uppermost redistribution patterns 112a to the redistribution patterns 112b disposed therebelow. In example embodiments, an upper surface of the upper redistribution via 113a may be coplanar with an upper surface of the first surface S1.

To prevent a defect (e.g., a void, bridge, hillock, or the like) occurring in a connection region (e.g., UBM region) between a bump (e.g., a solder bump) in which a current is concentrated and a redistribution pattern (e.g., a copper pattern) in a semiconductor package, a metal post 140 having a predetermined thickness may be introduced into the connection region between the bump and the redistribution pattern in the example embodiment. In an example embodiment, the metal post 140 may have a thickness (or a height) of about 50 μm or more to prevent defects caused by electromigration. For example, a height 140h of the metal posts 140 may be in the range of about 50 μm to about 100 μm, and heights 112h and 113h of the redistribution patterns 112 and the redistribution vias 113 may be in the range of about 5 μm to about 15 μm. As used herein, the terms "thickness" and "height" may refer to a thickness or height in a direction perpendicular to the first surface S1 or the second surface S2 (e.g., a vertical direction). For example, the height 140h of the metal post 140 may be the thickness or height from the first surface S1 to a lowermost surface of the metal post 140.

Also, to prevent undulation of the insulating layer 111 and the redistribution patterns 112 caused by the thickness of the metal posts 140, the insulating layer 111 and the redistribution patterns 112 may be formed, and the metal posts 140 may be formed in order. Accordingly, in an example embodiment, each of the redistribution vias 113 may have a tapered shape tapered toward an opposite side of the second surface S2 on which the metal post 140 is disposed. For example, the redistribution via 113 may have a tapered shape of which a width decreases toward the first surface S1. As used herein, the term "width" refers to a width in a direction parallel to the first surface S1 or the second surface S2 (e.g., a horizontal direction).

In the drawing, the passive device 170 mounted on the second surface S2 may be connected to the lower redistribution pattern 112b through the second metal bump Mb2 filling the via hole of the first lower insulating layer 111c. However, in example embodiments, the passive device 170 or the second metal bump Mb2 may be connected to the lower redistribution pattern 112b illustrated in FIG. 2 through an additional redistribution via penetrating the first lower insulating layer 111c and an additional redistribution pattern disposed on the first lower insulating layer 111c. The second metal bump Mb2 may be a plurality of second metal bumps Mb2, and each second metal bump Mb2 may have a land shape, a ball shape, or a pin shape, for example. The second metal bump Mb2 may include tin (Sn) or an alloy (e.g., Sn—Ag—Cu) including tin (Sn), for example.

The first and second semiconductor chips 121 and 122 may be disposed on the first surface S1 of the redistribution substrate 110 and may be electrically connected to the redistribution patterns 112 through the redistribution vias 113. Also, each of the first and second semiconductor chips 121 and 122 may be a logic chip or a memory chip. A logic chip may include, for example, a central processing unit (CPU), a graphics processing unit (GPU), a field programmable gate array (FPGA), a digital signal processor (DSP), a cryptographic processor, a microprocessor, a microcontroller, an analog-to-digital converter, and application-specific integrated circuit (ASIC). The memory chip may include, for example, a volatile memory device such as a dynamic RAM (DRAM), a static RAM (SRAM), or the like, a non-volatile memory device such as a phase change RAM (PRAM), a magnetic RAM (MRAM), a resistive RAM (RRAM), and a flash memory, or a high-performance memory device such as a high bandwidth memory (HBM) or a hybrid memory cubic (HMC). In an example embodiment, the semiconductor chips may include a first semiconductor chip 121 and at least one second semiconductor chip 122 electrically connected to each other through the redistribution vias 113 and redistribution patterns 112. In this case, the first semiconductor chip 121 may include the above-mentioned logic chip, and the at least one second semiconductor chip 122 may include the above-mentioned memory chip.

In an example, the first and second semiconductor chips 121 and 122 may be mounted on the redistribution substrate 110 by a flip-chip bonding method. For example, in the first semiconductor chip 121, an active surface on which a connection pad 121P is disposed may be disposed to face the first surface S1, and the connection pad 121P may be connected to the redistribution via 113 through the first metal bump Mb1. The first metal bump Mb1 may be a plurality of first metal bumps Mb1, and each first metal bump Mb1 may have a land shape, a ball shape, or a pin shape, for example. The first metal bump Mb1 may include tin (Sn) or an alloy (e.g., Sn—Ag—Cu) including tin (Sn), for example. The connection pad 121P may include, for example, a metal material such as aluminum (Al).

The first encapsulant 130 may be disposed on the first surface S1 of the redistribution substrate 110, and may encapsulate at least a portion of the first and second semiconductor chips 121 and 122. The first encapsulant 130 may include an insulating material, such as, for example, a thermosetting resin such as an epoxy resin, a thermoplastic resin such as a polyimide resin, or an inorganic filler and/or a glass fiber such as prepreg, Ajinomoto build-up film (ABF), FR-4, bismaleimide triazine (BT), an epoxy molding compound (EMC), or the like. In an example, an upper surface of the first encapsulant 130 may be coplanar with an upper surface of the first and second semiconductor chips 121 and 122 by a planarization process. As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Also, in an example, an underfill resin 131 filling lower portions of the first and second semiconductor chips 121 and 122, flip-chip bonded, may be formed. For example, the underfill resin 131 may be configured to fill a space between the first surface S1 and the first and second semiconductor chips 121 and 122 and to surround the plurality of first metal bumps Mb1. The underfill resin 131 may include a polymer material such as an epoxy resin.

The second encapsulant 150 may be disposed on the second surface S2 of the redistribution substrate 110, and may encapsulate at least side surfaces of the metal post 140 and the passive device 170. The second encapsulant 150 may also surround the second metal bumps Mb2. The second encapsulant 150 may include an insulating material similar to that of the first encapsulant 130, such as, for example, a thermosetting resin such as an epoxy resin, a thermoplastic resin such as a polyimide resin, or an inorganic filler and/or a glass fiber such as prepreg, ABF, FR-4, BT, an EMC, or the like. The first and second encapsulants 130 and 150 may include the same insulating material, such as EMC, for example, but an example embodiment thereof is not limited thereto. The second encapsulant 150 may protect the metal post 140 and the passive device 170 protruding from the second surface S2 of the redistribution substrate 110. By the planarization process, the lower surface of the second encapsulant 150 may be coplanar with the lower surface of the metal post 140 and the lower surface of the passive device 170. Alternatively, in example embodiments, the lower surface of the passive device 170 may be covered by the second encapsulant 150.

In the example embodiment, a second insulating layer 151 disposed on the third surface S3 provided by the lower surface of the metal post 140 and the lower surface of the second encapsulant 150, having an opening 150H filled by the connection bump 160 may be further included. The second insulating layer 151 may include an insulating resin similar to that of the first insulating layer 111 of the redistribution substrate 110. For example, the second insulating layer 151 may include a photosensitive resin. However, the first and second insulating layers 111 and 151 may not necessarily include the same type of insulating resin.

The metal post 140 may be disposed on the second surface S2 of the redistribution substrate 110 and may be electrically connected to the redistribution pattern 112. As described above, to prevent defects caused by a high-density current in the connection region between the connection bump 160 and the redistribution pattern 112, the metal post 140 may have a height 140$h$ (about 50 µm or more) greater than the heights 112$h$ and 113$h$ of the redistribution pattern 112 and the redistribution via 113. The metal post 140 may be electrically connected to the redistribution pattern 112$b$ through the redistribution via 113$c$ penetrating the first lower insulating layer 111$c$. The metal post 140 may include a plurality of metal posts 140 connected to a plurality of redistribution vias 113 penetrating the first lower insulating layer 111$c$, respectively. At least a portion of the plurality of metal posts 140 may be disposed to not overlap the first semiconductor chip 121 in a vertical direction, and may be electrically connected to the first semiconductor chip 121 through the redistribution patterns 112 and the redistribution vias 113. The metal post 140 may include a metal material including copper (Cu), aluminum (Al), silver (Ag), tin (Sn), gold (Au), nickel (Ni), lead (Pb), or titanium (Ti), or alloys thereof, for example.

The connection bump 160 may be directly disposed on the lower surface of the metal post 140 exposed from the second encapsulant 150. The connection bump 160 may include tin (Sn) or an alloy (e.g., Sn—Ag—Cu) including tin (Sn). In an example, a diffusion barrier layer may be formed between the connection bump 160 and the metal post 140. The diffusion barrier layer may have a single-layer structure or a multilayer structure including nickel (Ni), gold (Au), or the like. The connection bump 160 may be connected to a package substrate (see FIG. 6) or a main substrate to allow a high-density current to pass therethrough. Accordingly, defects may occur in the region adjacent to the connection bump 160, but in the example embodiment, by directly disposing the connection bump 160 on the metal post 140 having a predetermined thickness, the issue in which a current is concentrated in a narrow region may be addressed such that defects may be prevented.

The passive device 170 may be disposed on the second surface S2 of the redistribution substrate 110, and may be electrically connected to the first and second semiconductor chips 121 and 122 through the redistribution pattern 112 and the redistribution via 113. For example, the passive device 170 may be mounted on the second surface S2 by a flip-chip method, and may overlap the first semiconductor chip 121 and at least one of the plurality of second semiconductor chips 122 in a vertical direction. Accordingly, a connection path between the passive device 170 and the first semiconductor chip 121 or the second semiconductor chip 122 may be shortened. For example, the passive device 170 may include a connection pad 170P disposed to face the second surface S2, and the connection pad 170P may be connected to the redistribution pattern 112$b$ through the second metal bump Mb2. The connection pad 170P may include, for example, a metal material such as aluminum (Al).

The passive device 170 may be a plurality of passive device 170, and each passive device 170 may include, for example, a capacitor, an inductor, or beads. The passive device 170 may improve signal integrity (SI) and/or power integrity (PI) properties of the semiconductor package. In the example embodiment, a mounting space of the passive device 170 on the second surface S2 of the redistribution substrate 110 may be secured by the thickness of the metal post 140. Accordingly, the passive device 170 may have a thickness corresponding to the thickness of the metal post 140, which may be in the range of about 50 µm to about 100 µm. However, the thickness of the passive device 170 is not limited to the above example, and the passive device 170 having various sizes, having a thickness less than that of the metal post 140, may be used such that the lower surface of the passive device 170 does not protrude further than the lower surface of the metal post 140. For example, a thickness of the passive device 170 may be determined such that lower surfaces of the passive device 170 and the metal post 140 are coplanar with one another.

As described above, in the example embodiment, the metal post 140 having a predetermined height may be included to prevent defects caused by a high-density current in the connection region between the connection bump 160 and the redistribution pattern 112. Similarly, to prevent defects occurring in the connection region between the first metal bump Mb1 electrically connecting the first and second semiconductor chips 121 and 122 to the redistribution pattern 112 and the redistribution pattern 112, the uppermost redistribution via 113$a$ directly connecting the first metal bump Mb1 to the redistribution pattern 112 may have a width greater than the width of the redistribution vias 113$b$ and 113$c$ disposed therebelow.

For example, referring to FIG. 2, the redistribution substrate 110 may include a plurality of first insulating layers 111$a$, 111$b$, and 111$c$, a plurality of redistribution patterns 112$a$ and 112$b$ disposed on the plurality of first insulating layers 111$a$, 111$b$, and 111$c$, and a plurality of redistribution vias 113$a$, 113$b$, and 113$c$ penetrating the plurality of first insulating layers 111$a$, 111$b$, and 111$c$ and connected to the plurality of redistribution patterns 112$a$ and 112$b$. The numbers of layers of the first insulating layers 111$a$, 111$b$, and 111$c$, the redistribution patterns 112$a$ and 112$b$, and the redistribution vias 113$a$, 113$b$, and 113$c$ illustrated in FIG. 2 are examples, and a greater number of the first insulating layers 111$a$, 111$b$, and 111$c$, a greater number of layers of the redistribution patterns 112$a$ and 112$b$, and a greater number of layers of the redistribution vias 113$a$, 113$b$, and 113$c$ may be included in the redistribution substrate 110.

The plurality of redistribution vias 113a, 113b, and 113c may include an upper redistribution via 113a (or the first redistribution via) adjacent to the first surface S1 and connecting the to the uppermost redistribution pattern 112a (or the first redistribution pattern), a second redistribution via 113c adjacent to the second surface S2 and connecting the metal post 140 to the lower redistribution pattern 112b (or the second redistribution pattern), and a third redistribution via 113b (or the lower redistribution via) disposed on a level between the first and second redistribution vias 113a and 113c and connecting the uppermost redistribution pattern 112a (or the first redistribution pattern) to the lower redistribution pattern 112b (or the second redistribution pattern) disposed therebelow. In this case, a maximum width Wa of the first redistribution via 113a in the horizontal direction may be greater than a maximum width Wc and Wb of at least one of the second redistribution via 113c and the third redistribution via 113b in the horizontal direction.

FIG. 3 is an enlarged cross-sectional diagram illustrating a portion of a semiconductor package 100B according to an example embodiment, illustrating only a portion of the elements of the semiconductor package 100B corresponding to section 'A' of FIG. 2.

Referring to FIG. 3, the semiconductor package 100B according to an example embodiment may be configured similarly to the example embodiment illustrated in FIG. 1A other than the configuration in which a maximum width Wc of the second redistribution via 113c in the horizontal direction, connecting the metal post 140 to the second redistribution pattern 112b, may be greater than a maximum width Wb of the third redistribution via 113b in the horizontal direction. In this case, a size relationship between the maximum width Wa of the first redistribution via 113a and the maximum width Wc of the second redistribution via 113c is not limited to any particular example. For example, the maximum width Wa of the first redistribution via 113a may be greater than the maximum width Wc of the second redistribution via 113c, or the maximum width Wa of the first redistribution via 113a may be less than the maximum width Wc of the second redistribution via 113c. The maximum widths Wa and Wc of the first and second redistribution vias 113a and 113c in the horizontal direction may be greater than the maximum width Wb of the third redistribution via 113b in the horizontal direction. According to an example embodiment, connection reliability between the metal post 140 and the redistribution pattern 112 may be secured, and defects between the metal post 140 and the redistribution pattern 112 may be prevented.

Figure 4:
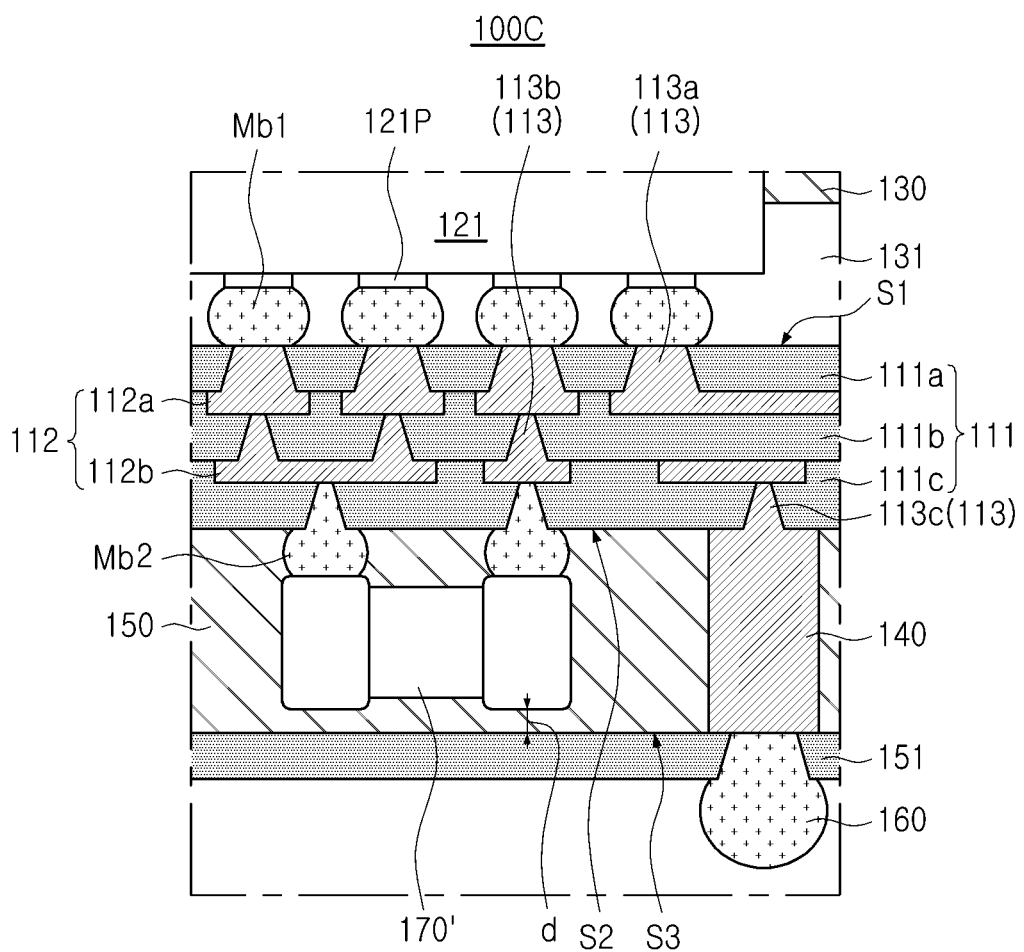
FIG. 4 is an enlarged cross-sectional diagram illustrating a portion of a semiconductor package, according to an example embodiment of the present disclosure.

FIG. 4 is an enlarged cross-sectional diagram illustrating a portion of a semiconductor package 100C according to an example embodiment, illustrating only a portion of the elements of the semiconductor package 100C corresponding to section 'A' of FIG. 2.

Referring to FIG. 4, the semiconductor package 100C in an example embodiment may be configured similarly to the example illustrated in FIG. 1A other than the configuration in which the lower surface of the passive device 170' may be spaced apart from the lower surface of the second encapsulant 150 by a predetermined distance d. In an example embodiment, the passive device 170' may have a height lower than a height of the metal post 140, and only the lower surface of the metal post 140 may be exposed during the process of planarization of the second encapsulant 150. For example, a lowermost surface of the metal post 140 may be at a level further away from the second surface than a lowermost surface of the passive device 170'. Accordingly, a lowermost surface of the passive device 170' may be spaced apart from the lower surface S3 of the second encapsulant 150 by the predetermined distance d. For example, the lowermost surface of the passive device 170' may be covered by the second encapsulant 150, and the second encapsulant 150 may contact the lowermost surface of the passive device 170'. In FIG. 4, the passive device 170' may be implemented in the form of a multilayer ceramic capacitor, but the passive device applicable to the example embodiment is not limited thereto. In the example embodiment, regardless of the type of the passive device 170', the passive device 170' having a height lower than that of the metal post 140 may be employed. As used herein, the term "contact" refers to direct touching, unless the context indicates otherwise.

Figure 5:
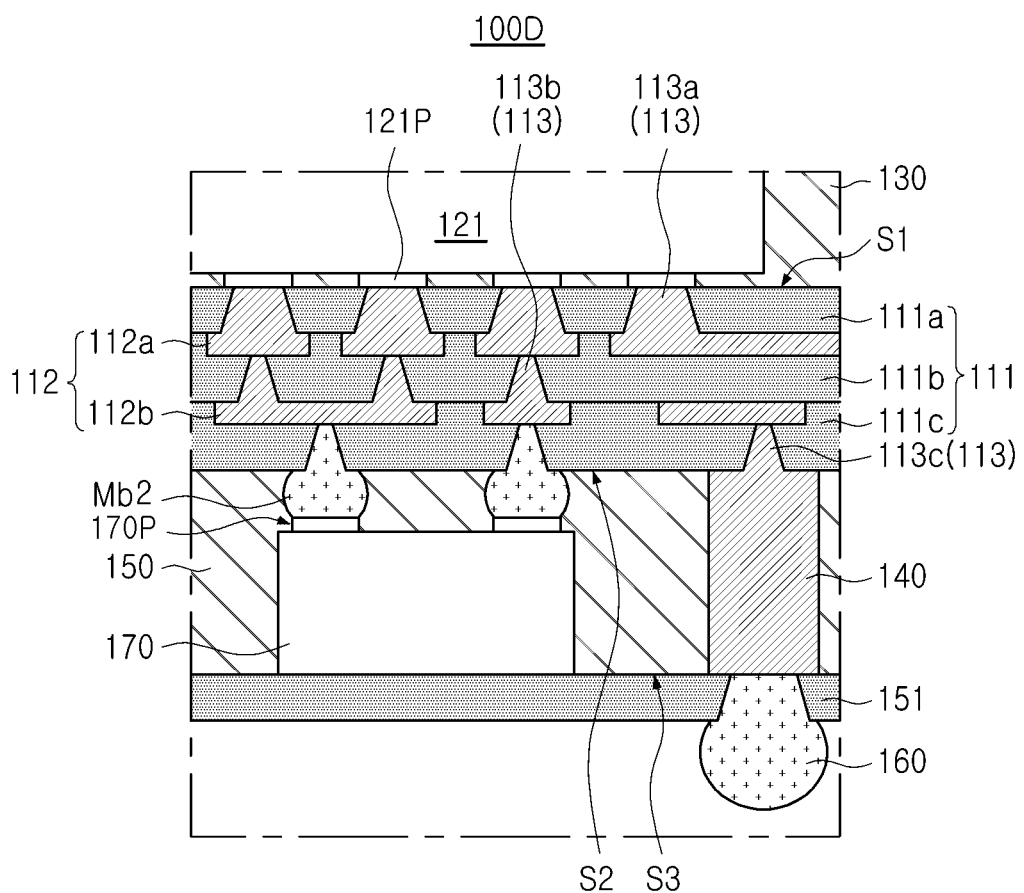
FIG. 5 is an enlarged cross-sectional diagram illustrating a portion of a semiconductor package, according to an example embodiment of the present disclosure.

FIG. 5 is an enlarged cross-sectional diagram illustrating a portion of a semiconductor package 100D according to an example embodiment, illustrating only a portion of the elements of the semiconductor package 100D corresponding to section 'A' of FIG. 2.

Referring to FIG. 5, the semiconductor package 100D in an example embodiment may be configured similarly to the example illustrated in FIG. 1A other than the configuration in which the first semiconductor chip 121 and the second semiconductor chip 122 (FIG. 1A) may be mounted on the first surface S1 of the redistribution substrate 110 without a bump. In the example embodiment, to form the metal post 140 having a predetermined thickness without undulation, a plurality of first insulating layers 111 from the first surface S1 to the second surface S2, a plurality of redistribution patterns 112, and a plurality of redistribution vias 113 may be built up in the first insulating layer 111. Accordingly, when the plurality of first insulating layers 111, the plurality of redistribution patterns 112, and the plurality of redistribution vias 113 are directly formed on the lower surfaces of the first semiconductor chip 121 and the first encapsulant 130, the connection pad 121P of the first semiconductor chip 121 may be in direct contact with the redistribution via 113 without a first metal bump Mb1 (in FIG. 1A). In this case, an overall thickness of the package may be reduced, and connection reliability between the semiconductor chip and the redistribution pattern (or the redistribution via) may improve. Also, in the example embodiment, the underfill resin 131 illustrated in FIG. 1A may not be provided.

Figure 6:
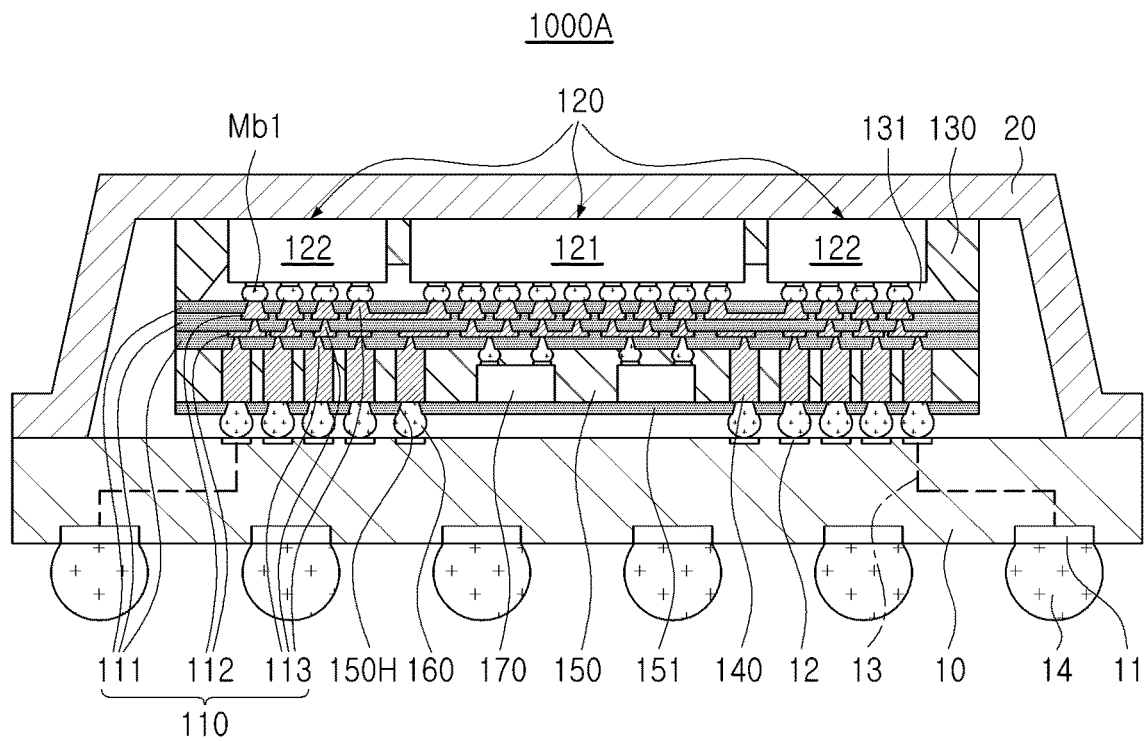
FIG. 6 is a cross-sectional diagram illustrating a semiconductor package, according to an example embodiment of the present disclosure.

FIG. 6 is a cross-sectional diagram illustrating a semiconductor package 1000A according to an example embodiment.

Referring to FIG. 6, the semiconductor package 1000A in an example embodiment may be configured similarly to the example illustrated in FIG. 1A other than the configuration in which the semiconductor package 1000A may further include a base substrate 10 and a heat dissipation structure 20. The semiconductor packages illustrated in FIGS. 1A to 5 may be mounted on the base substrate 10.

The base substrate 10 may be a support substrate on which the redistribution substrate 110, the semiconductor chips 120, and the heat dissipation structure 20 are mounted, and may be configured as a substrate for a package including a wiring circuit 13 electrically connected to the redistribution substrate 110 and the semiconductor chips 120. The substrate for the package may include a printed circuit board (PCB), a ceramic substrate, a glass substrate, a tape wiring board, and the like. The base substrate 10 may include a lower pad 11 and an upper pad 12 electrically connected to an external entity on a lower surface and an upper surface thereof, respectively. Also, the base substrate 10 may include a wiring circuit 13 connected to the lower and upper pads 11 and 12 therein. An electrical connection metal 14 connected to the lower pad 11 may be disposed below the base substrate 10.

The heat dissipation structure 20 may be disposed on the upper surface of the base substrate 10 and may cover the redistribution substrate 110 and the semiconductor chips 120. The heat dissipation structure 20 may be attached to the base substrate 10 by an adhesive. As the adhesive, a thermally conductive adhesive tape, thermally conductive grease, thermally conductive adhesive, or the like, may be used. The heat dissipation structure 20 may be in direct contact with the upper surface of the semiconductor chip 120, but may be attached to the semiconductor chip 120 through an adhesive member (not illustrated). The heat dissipation structure 20 may include a conductive material having excellent thermal conductivity. For example, the heat dissipation structure 20 may include a metal or a metal alloy including gold (Au), silver (Ag), copper (Cu), iron (Fe), or the like, or a conductive material including graphite, graphene, or the like. The heat dissipation structure 20 may have a shape different from the example illustrated in the drawings, and may not be provided in example embodiments.

Figure 7:
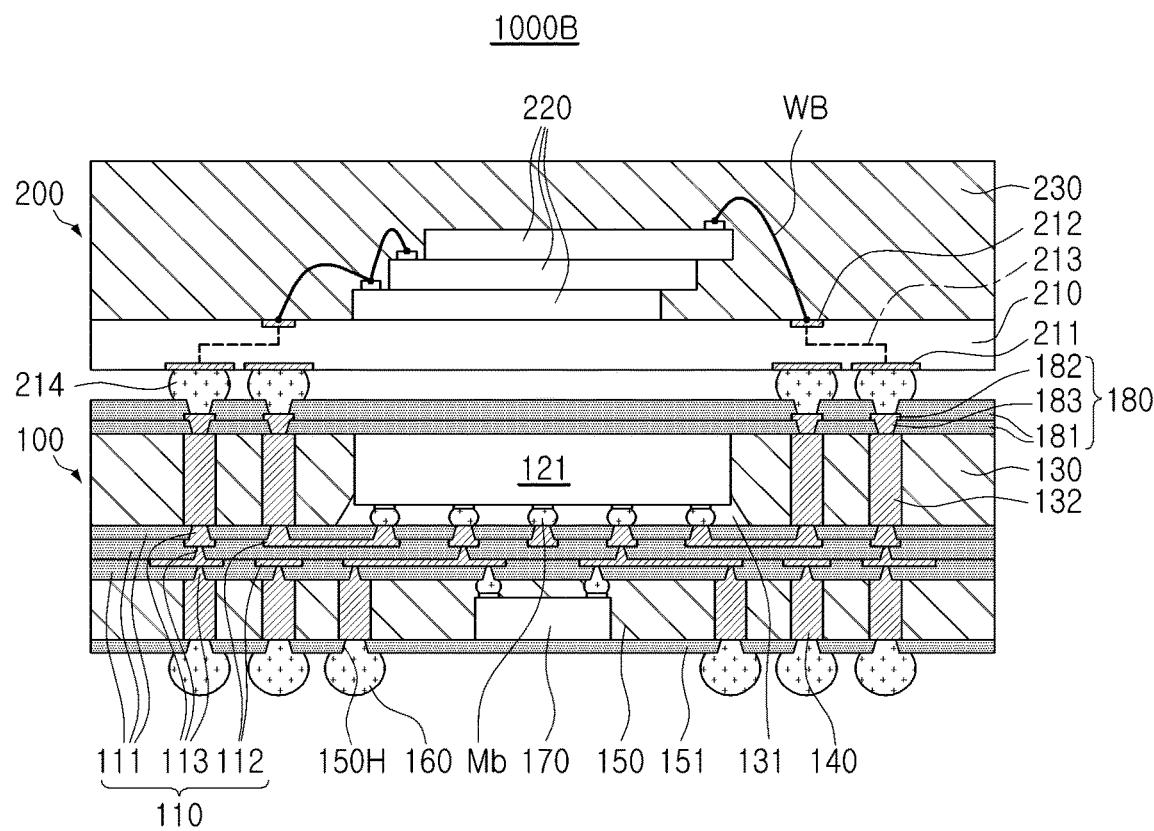
FIG. 7 is a cross-sectional diagram illustrating a semiconductor package, according to an example embodiment of the present disclosure.

FIG. 7 is a cross-sectional diagram illustrating a semiconductor package 1000B according to an example embodiment.

Referring to FIG. 7, a semiconductor package 1000B according to an example embodiment may include a first package 100 and a second package 200. The first package 100 may be configured similarly to the semiconductor packages 100A, 100B, 100C, and 100D illustrated in FIGS. 1A to 5 other than the configuration in which the semiconductor package 1000B may further include a through via 132 penetrating the first encapsulant 130 and a rear redistribution structure 180. The through via 132 may be electrically connected to the redistribution pattern 112. For example, a lower surface of the through via 132 may contact an upper surface of the redistribution via 113 exposed by an uppermost one of the first insulating layers 111 (e.g., first upper insulating layer 111a). The through via 132 may have a post shape through which a conductor may pass through at least a portion of the first encapsulant 130. The through via 132 may provide an electrical connection path penetrating the first package 100 in a vertical direction. In example embodiments, an upper surface of the through via 132 may be coplanar with an upper surface of the first encapsulant 130, and a lower surface of the through via 132 may be coplanar with a lower surface of the first encapsulant 130.

The rear redistribution structure 180 may include a rear insulating layer 181, a rear redistribution pattern 182 disposed on the rear insulating layer 181, and a rear redistribution via 183 penetrating the rear insulating layer 181 and connecting the rear redistribution pattern 182 to the through via 132. The rear insulating layer 181 may be disposed on the upper surface of the first encapsulant 130. The rear insulating layer 181 may be configured to cover the upper surface of the through via 132 exposed on the upper surface of the first encapsulant 130 and the upper surface of the first semiconductor chip 121. In an example, the upper surface of the first semiconductor chip 121 may not be exposed to the upper surface of the first encapsulant 130. The rear insulating layer 181 may include an insulating resin similar to that of the first insulating layer 111, such as, for example, a photosensitive resin. The rear redistribution pattern 182 and the rear redistribution via 183 may include a conductive material similar to the redistribution pattern 112 and the redistribution via 113 of the redistribution substrate 110.

The second package 200 may include a second redistribution substrate 210, a second semiconductor chip 220, and a second encapsulant 230. The second redistribution substrate 210 may include redistribution pads 211 and 212 electrically connected to an external entity on a lower surface and an upper surface thereof, respectively. Also, the second redistribution substrate 210 may include a redistribution circuit 213 connected to the redistribution pads 211 and 212 therein.

The second semiconductor chip 220 may be mounted on the second redistribution substrate 210 by wire bonding or flip-chip bonding. The second semiconductor chip 220 may be a plurality of second semiconductor chips 220. For example, the plurality of second semiconductor chips 220 may be vertically stacked on the second redistribution substrate 210, and may be electrically connected to the redistribution pads 212 on the upper surface of the second redistribution substrate 210 by a bonding wire WB. The second semiconductor chip 220 may include a memory chip, and the first semiconductor chip 121 may include an application processor (AP) chip.

The second encapsulant 230 may include a material the same as or similar to a material of the first encapsulant 130 of the first package 100. The second package 200 may be physically and electrically connected to the first package 100 by the metal bumps 214. The metal bumps 214 may be electrically connected to the redistribution circuit 213 in the second redistribution substrate 210 through the redistribution pad 211 on the lower surface of the second redistribution substrate 210. The metal bumps 214 may be formed of a low-melting-point metal, such as, for example, tin (Sn) or an alloy including tin (Sn).

Figure 8:
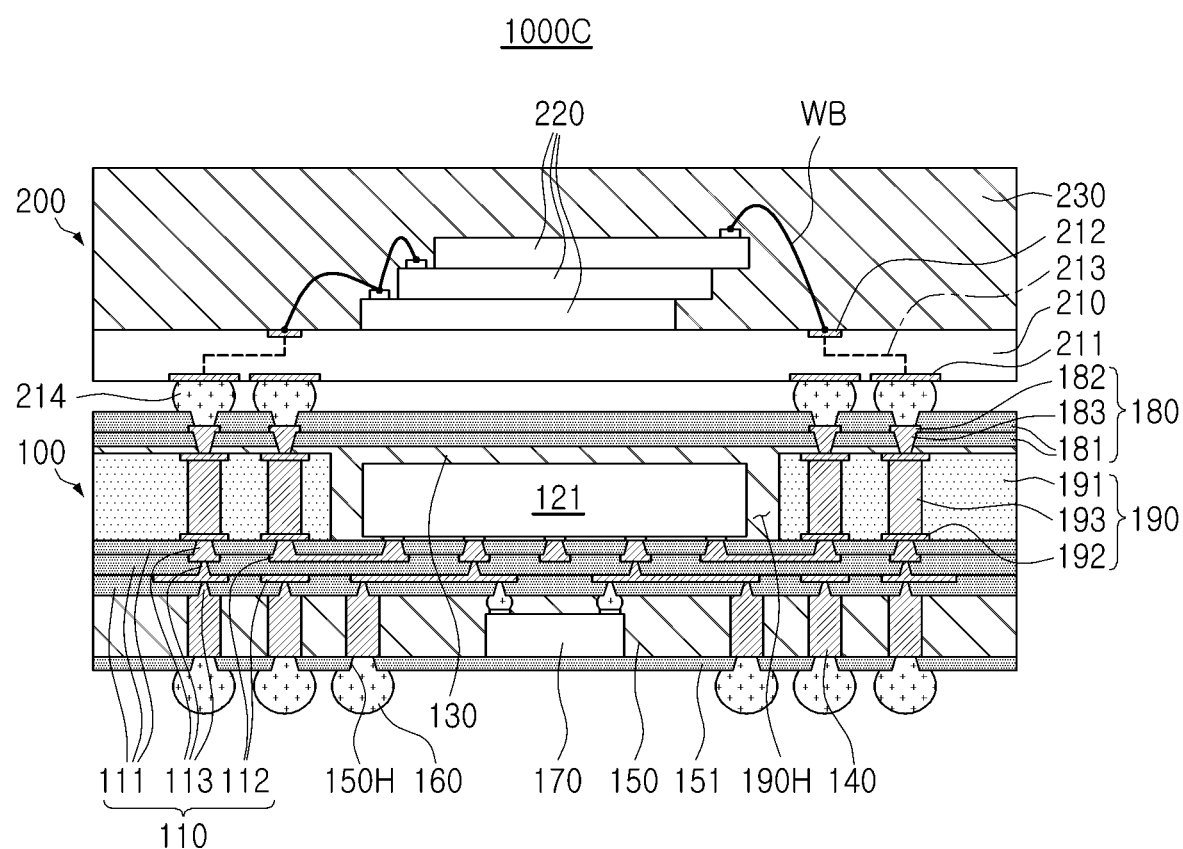
FIG. 8 is a cross-sectional diagram illustrating a semiconductor package, according to an example embodiment of the present disclosure.

FIG. 8 is a cross-sectional diagram illustrating a semiconductor package 1000C according to an example embodiment.

Referring to FIG. 8, the semiconductor package 1000C according to an example embodiment may be configured similarly to the example embodiment illustrated in FIG. 7, other than the configuration in which the semiconductor package 1000C may include vertical connection structures 190 instead of the through vias 132 in FIG. 7. The vertical connection structure 190 may include an insulating resin 191, a wiring layer 192, and a wiring via 193. The wiring layer 192 may be provided on upper and lower surfaces of the wiring via 193. For example, an upper surface of the wiring layer 192 on the upper surface of the wiring via 193 may be coplanar with an upper surface of the insulating resin 191, and a lower surface of the wiring layer 192 on the lower surface of the wiring via 193 may be coplanar with a lower surface of the insulating resin 191. The vertical connection structure 190 may further improve rigidity of the first package 100 depending on a material of the insulating resin 191, and may improve uniformity of a thickness of the first encapsulant 130. The vertical connection structure 190 may have a through-hole 190H penetrating the insulating resin 191. The first semiconductor chip 121 may be disposed in the through-hole 190H. A wall of the through-hole 190H may be configured to surround the first semiconductor chip 121, but an example embodiment thereof is not limited thereto.

A material of the insulating resin 191 is not limited to any particular example. For example, an insulating material may be used. In this case, as the insulating material, a thermosetting resin such as an epoxy resin, a thermoplastic resin such as polyimide, or a resin in which the resins are mixed with an inorganic filler, such as ABF may be used, for example. Alternatively, a material in which the above-described resin is impregnated in glass fiber (glass fiber, glass cloth, glass fabric) together with an inorganic filler, such as, for example, prepreg may be used.

The wiring layer 192 may provide an electrical connection path electrically connected to the redistribution pattern 112 of the redistribution substrate 110 and vertically crossing the first package 100 together with the wiring via 193. The wiring layer 192 may include copper (Cu), aluminum (Al), silver (Ag), tin (Sn), gold (Au), nickel (Ni), lead (Pb), titanium (Ti), or alloys thereof. The wiring layer 192 may be formed by a plating process.

The wiring via 193 may electrically connect the wiring layers 192 formed in different levels to each other, and accordingly, an electrical path may be formed in the vertical connection structure 190. The wiring via 193 may include copper (Cu), aluminum (Al), silver (Ag), tin (Sn), gold (Au), nickel (Ni), lead (Pb), titanium (Ti), or alloys thereof. The wiring via 193 may be a filled-type via filled with a metal material, or a conformal-type via in which a metal material is formed along a wall surface of a via hole.

FIGS. 9A to 9E are cross-sectional diagrams illustrating a process of manufacturing the semiconductor package illustrated in FIG. 1A.

Figure 9A:
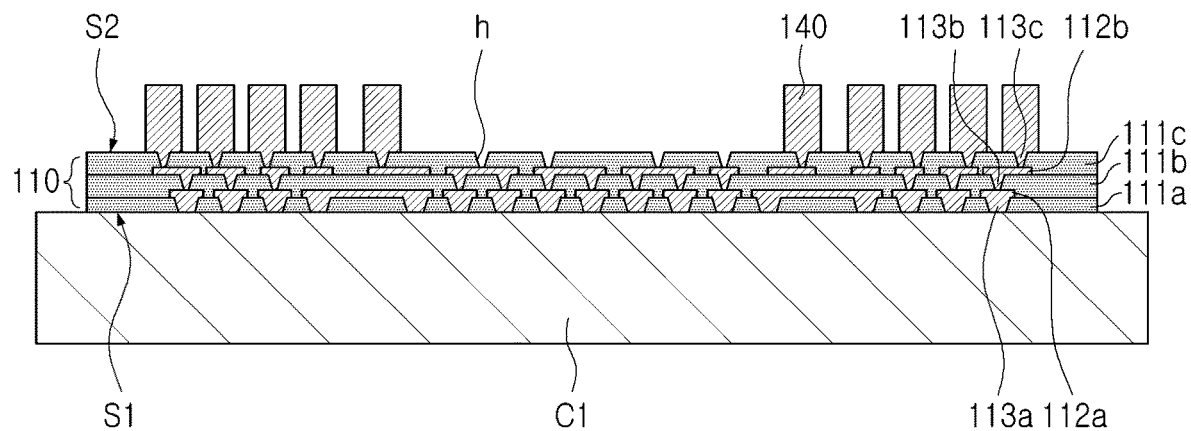
FIGS. 9A to 9E are cross-sectional diagrams illustrating a process of manufacturing the semiconductor package illustrated in FIG. 1A.

Referring to FIG. 9A, a redistribution substrate 110 may be formed on a first carrier C1, and a metal post 140 may be formed on the second surface S2 of the redistribution substrate 110. Between the first carrier C1 and the redistribution substrate 110, the redistribution substrate 110 may be formed by building up a plurality of first insulating layers 111a, 111b, and 111c, a plurality of redistribution patterns 112a and 112b, and a plurality of redistribution vias 113a, 113b, and 113c on the first carrier C1. The plurality of first insulating layers 111a, 111b, and 111c may be formed by coating and curing a photosensitive resin, for example. The plurality of redistribution patterns 112a and 112b and the plurality of redistribution vias 113a, 113b, and 113c may be formed using a photo process, an etching process, and a plating process. The metal post 140 may be formed by patterning a photoresist film formed to have a predetermined height (about 50 μm or more) and plating a metal material. The metal post 140 may be integrated with an uppermost redistribution via 113c (see FIG. 9A). A portion of the via holes h in which the metal post 140 is not formed may expose a portion of the redistribution pattern 112b.

Figure 9B:
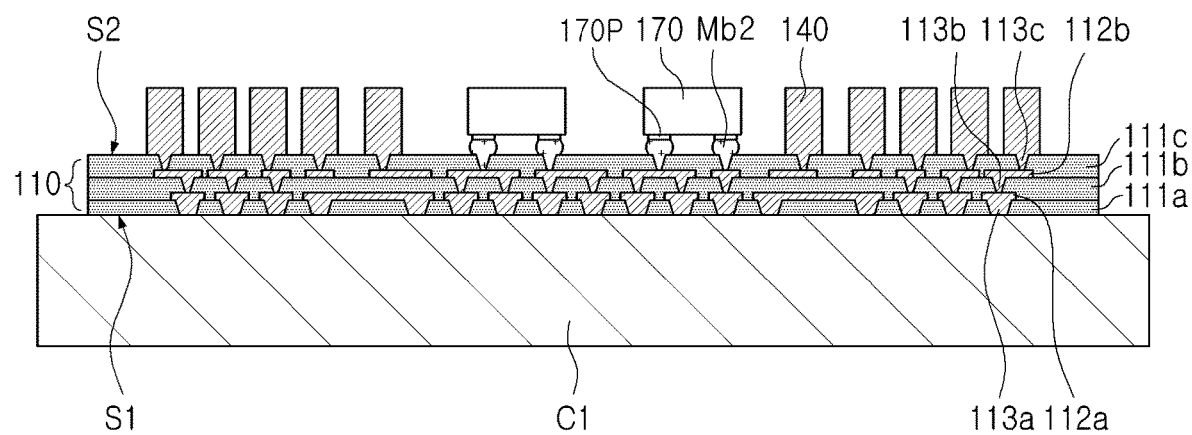

Referring to FIG. 9B, the passive device 170 may be mounted on the second surface S2 of the redistribution substrate 110. The passive device 170 may be mounted on the second surface S2 by a flip-chip method. For example, the passive device 170 may include a connection pad 170P disposed to face the second surface S2, and the passive device may be electrically connected to the redistribution pattern 112b through the connection pad 170P and the second metal bump Mb2 filling the via holes h in FIG. 9A. The passive device 170 may be disposed in a position connected to the semiconductor chips mounted on the first surface S1 by a shortest distance. The passive device 170 may be disposed in a central portion of the redistribution substrate 110 in the drawing, but the position of the passive device 170 is not limited thereto. For example, the passive device 170 may be disposed on an edge portion of the redistribution substrate 110 to be connected to the second semiconductor chip 122 (in FIG. 9E).

Figure 9C:
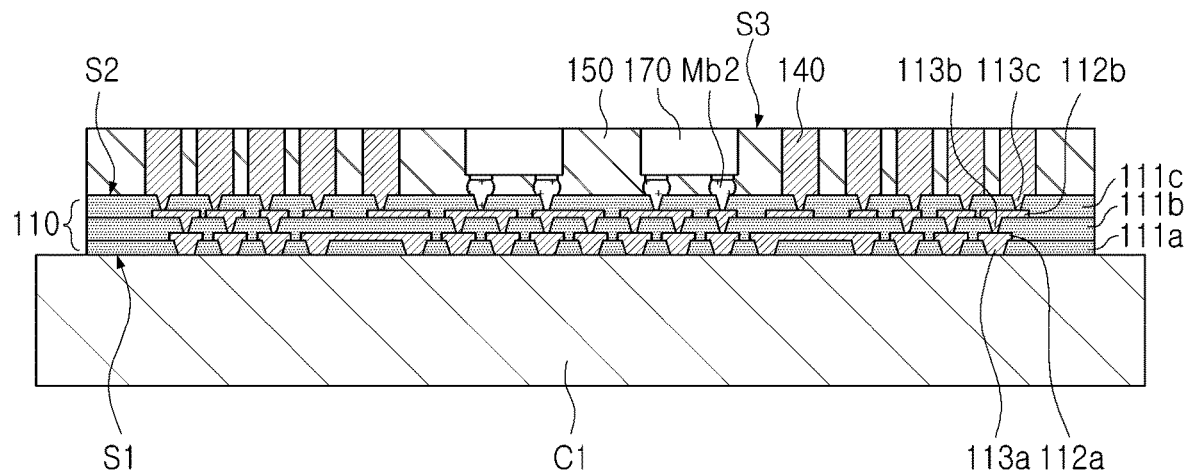

Referring to FIG. 9C, a second encapsulant 150 may be formed on a second surface S2 of the redistribution substrate 110. The second encapsulant 150 may be formed to cover the metal post 140 and the passive device 170, and upper surfaces of the metal post 140 and the passive device 170 may be configured to be exposed to an upper surface of the second encapsulant 150. For example, the upper surface of the second encapsulant 150, the upper surface of the metal post 140, and the upper surface of the passive device 170 may be coplanar. Accordingly, the upper surface of the second encapsulant 150, the upper surface of the metal post 140, and the upper surface of the passive device 170 may form the same plane S3 (hereinafter, "third surface"). The second encapsulant 150 may include EMC, for example.

Figure 9D:
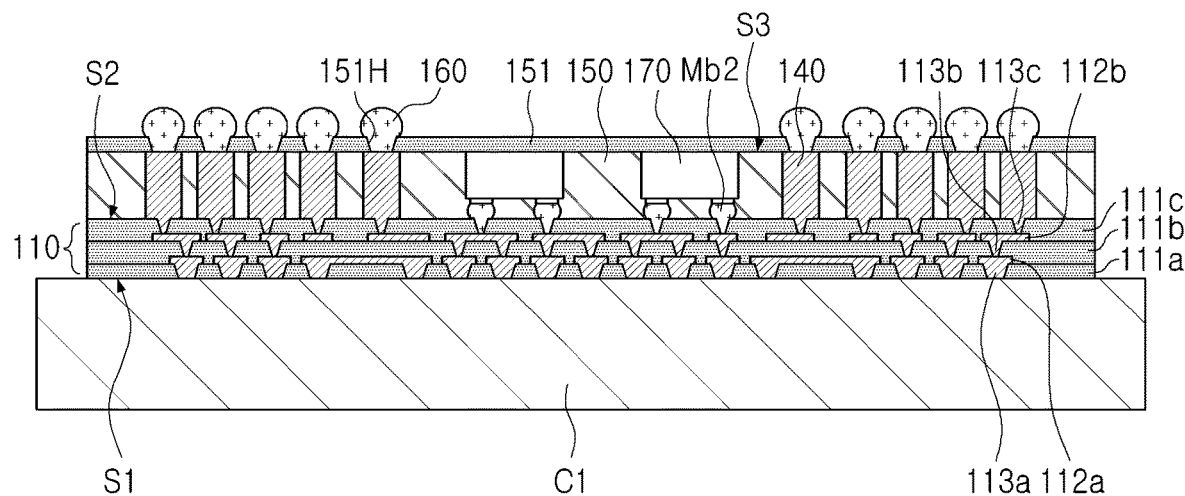

Referring to FIG. 9D, a second insulating layer 151 having an opening 151H may be formed on the third surface S3, and a connection bump 160 filling the opening 151H may be formed. The second insulating layer 151 may cover the upper surface of the metal post 140 and the upper surface of the passive device 170 to protect the elements. The second insulating layer 151 may be formed by coating and curing a photosensitive resin, for example, and an opening 151H penetrating the second insulating layer 151 may be formed using a photo process and an etching process. The second insulating layer 151 may be formed as a single layer having a thickness smaller than that of the second encapsulant 150. The connection bump 160 may be directly formed on the upper surface of the metal post 140 exposed through the opening 151H. In an example, a diffusion barrier layer may be formed between the connection bump 160 and the metal post 140.

Figure 9E:
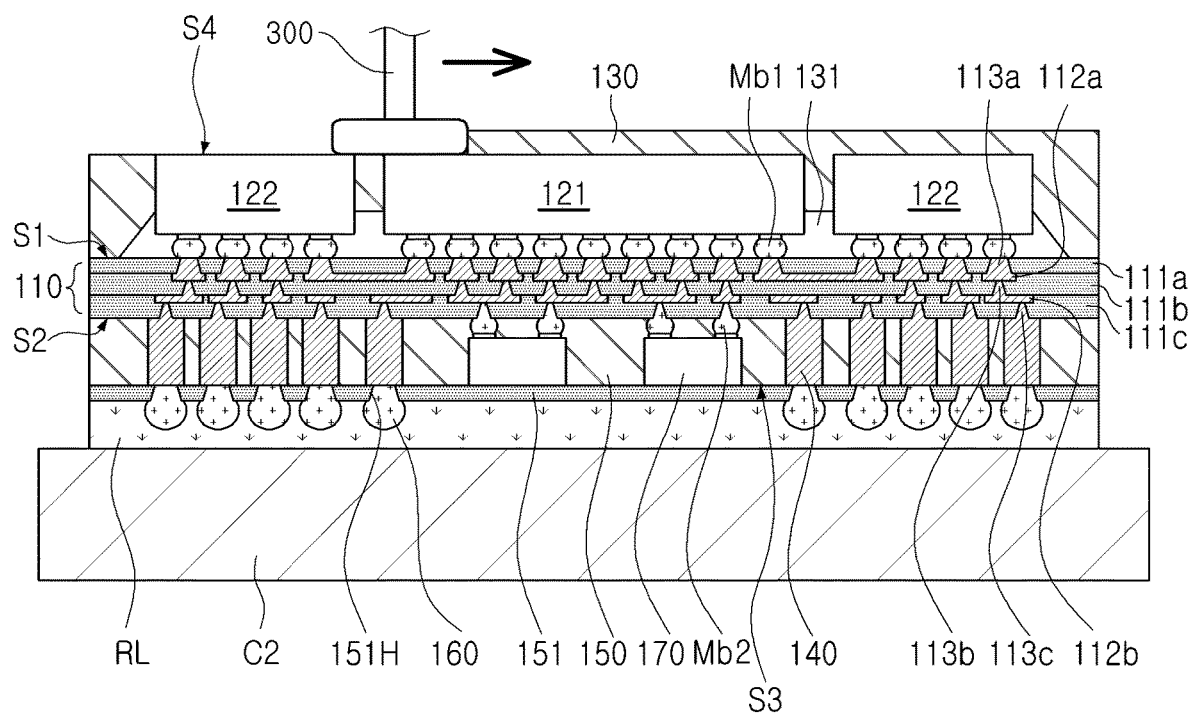

Referring to FIG. 9E, the first carrier C1 in FIG. 9D may be removed, and the redistribution substrate 110 may be attached to the second carrier C2 such that the second surface S2 may oppose downwardly. A release layer RL may be disposed between the second carrier C2 and the redistribution substrate 110. Thereafter, the first and second semiconductor chips 121 and 122 may be mounted on the first surface S2 of the redistribution substrate 110, and a first encapsulant 130 may be formed. The first and second semiconductor chips 121 and 122 may be mounted on the redistribution substrate 110 in a flip-chip form. The first encapsulant 130 may include EMC, for example, and a portion of the first encapsulant 130 may be removed by a planarization process such that the upper surfaces of the first and second semiconductor chips 121 and 122 may be exposed. For example, a planarization device 300 may be used to remove the portion of the first encapsulant 130 and expose the upper surfaces of the first and second semiconductor chips 121 and 122. Before forming the first encapsulant 130, an underfill resin 131 may be formed. In an example, a boundary between the underfill resin 131 and the first encapsulant 130 may not be distinct by a mold underfill process.

According to the aforementioned example embodiments, by forming the UBM structure to have an increased thickness, a semiconductor package having excellent reliability may be provided.

Also, by mounting a passive device in a space secured by the UBM structure, a semiconductor package having improved power integrity (PI) properties may be provided.

While the example embodiments have been illustrated and described above, it will be apparent to those skilled in the art that modifications and variations could be made without departing from the scope of the present disclosure as defined by the appended claims.

What is claimed is:

1. A semiconductor package, comprising:
 a redistribution substrate having a first surface and a second surface opposite the first surface, and including a first insulating layer, a redistribution pattern disposed on the first insulating layer, and a redistribution via penetrating the first insulating layer and electrically connected to the redistribution pattern;

a first semiconductor chip disposed on the first surface of the redistribution substrate and electrically connected to the redistribution pattern;

a first encapsulant disposed on the first surface of the redistribution substrate and encapsulating at least a portion of the first semiconductor chip;

a passive device and a metal post disposed on the second surface of the redistribution substrate and electrically connected to the redistribution pattern;

a second encapsulant disposed on the second surface of the redistribution substrate and encapsulating at least side surfaces of the passive device and the metal post;

a second insulating layer disposed on a lower surface of the metal post and a lower surface of the second encapsulant, and having an opening exposing at least a portion of the lower surface of the metal post; and a connection bump filling the opening of the second insulating layer and in direct contact with the lower surface of the exposed metal post, wherein the metal post has a height greater than a height of each of the redistribution pattern and the redistribution via, wherein the redistribution via includes a plurality of redistribution vias disposed on different levels, wherein the plurality of redistribution vias include a first redistribution via connecting the first semiconductor chip to the redistribution pattern, a second redistribution via connecting the metal post to the redistribution pattern, and a third distribution via disposed between the first and second redistribution vias, and wherein a maximum width of the first redistribution via a horizontal direction is greater than a maximum width of the third redistribution via in the horizontal direction.

2. The semiconductor package of claim 1, wherein the height of the metal post is in a range of about 50 μm to about 100 μm.

3. The semiconductor package of claim 2, wherein the height of each of the redistribution pattern and the redistribution via is in a range of about 5 μm to about 15 μm.

4. The semiconductor package of claim 1, wherein the redistribution via has a tapered shape of which a width decreases toward the first surface.

5. The semiconductor package of claim 1, wherein the lower surface of the metal post is coplanar with the lower surface of the second encapsulant.

6. The semiconductor package of claim 5, wherein the height of the metal post is greater than the height of the passive device.

7. The semiconductor package of claim 5, wherein the lower surface of the passive device is coplanar with the lower surface of the metal post and the lower surface of the second encapsulant.

8. The semiconductor package of claim 1, wherein the passive device is mounted on the second surface in a flip-chip manner.

9. The semiconductor package of claim 1, wherein the passive device is disposed to overlap the first semiconductor chip in a vertical direction, and is electrically connected to the first semiconductor chip through the redistribution pattern and the redistribution via.

10. The semiconductor package of claim 1, wherein the metal post is disposed such that at least a portion thereof does not overlap the first semiconductor chip in a vertical direction, and the metal post is electrically connected to the first semiconductor chip through the redistribution pattern and the redistribution via.

11. The semiconductor package of claim 1, wherein the connection bump includes tin (Sn) or a metal alloy including tin (Sn).

12. The semiconductor package of claim 1,
wherein a maximum width of the second redistribution via in the horizontal direction is greater than the maximum width of the third redistribution via in the horizontal direction.

13. The semiconductor package of claim 12, wherein the first semiconductor chip is spaced apart from the first surface and is connected to the first redistribution via through a metal bump.

14. The semiconductor package of claim 1, further comprising:
at least one second semiconductor chip disposed on the first surface of the redistribution substrate, and electrically connected to the first semiconductor chip through the redistribution pattern.

15. The semiconductor package of claim 14,
wherein the first semiconductor chip includes a logic chip, and
wherein the at least one second semiconductor chip includes a memory chip.

16. The semiconductor package of claim 1, wherein the first and second encapsulants include an epoxy molding compound.

17. A semiconductor package, comprising:
a redistribution substrate having a first surface and a second surface opposite the first surface, and including a plurality of first insulating layers, a plurality of redistribution patterns disposed on the plurality of first insulating layers, and a plurality of redistribution vias penetrating the plurality of first insulating layers and electrically connected to the plurality of redistribution patterns;

a first semiconductor chip and a plurality of second semiconductor chips disposed on the first surface of the redistribution substrate and electrically connected to the plurality of redistribution patterns through the plurality of redistribution vias;

at least one passive device disposed on the second surface of the redistribution substrate to overlap the first semiconductor chip and at least a portion of the plurality of second semiconductor chips in a vertical direction and electrically connected to the plurality of redistribution patterns;

a plurality of metal posts disposed on the second surface of the redistribution substrate and electrically connected to the plurality of redistribution patterns through the plurality of redistribution vias;

an encapsulant disposed on the second surface of the redistribution substrate and encapsulating side surfaces of the plurality of metal posts and the at least one passive device; and a plurality of connection bumps, each of the plurality of connection bumps in direct contact with a lower surface of a corresponding one of the plurality of metal posts, wherein the plurality of redistribution vias include a first redistribution via adjacent to the first surface, a second redistribution via adjacent to the second surface, and a third redistribution via disposed on a level between the first and second redistribution vias, and wherein a maximum width of the first redistribution via in a horizontal direction is greater than at least one of a maximum width of the second redistribution via and a maximum width of the third redistribution via in the horizontal direction.

18. The semiconductor package of claim 17, wherein the maximum width of the second redistribution via in the horizontal direction is greater than the maximum width of the third redistribution via in the horizontal direction.

19. The semiconductor package of claim 17, further comprising:
- a plurality of metal bumps connecting the first semiconductor chip and the plurality of second semiconductor chips to a plurality of first redistribution vias, the plurality of first redistribution vias including the first redistribution via; and
- an underfill resin filling a region between the first surface and the first semiconductor chip and the plurality of second semiconductor chips and surrounding the plurality of metal bumps.

20. A semiconductor package, comprising:
- a redistribution substrate having a first surface and a second surface opposite the first surface, and including a plurality of first insulating layers, a plurality of redistribution patterns disposed on the plurality of first insulating layers, and a plurality of redistribution vias penetrating the plurality of first insulating layers and electrically connected to the plurality of redistribution patterns;
- a first semiconductor chip disposed on the first surface of the redistribution substrate and electrically connected to the plurality of redistribution patterns through the plurality of redistribution vias;
- a plurality of metal posts disposed on the second surface of the redistribution substrate and electrically connected to the plurality of redistribution patterns through the plurality of redistribution vias;
- an encapsulant disposed on the second surface of the redistribution substrate and encapsulating a side surface of each of the plurality of metal posts; and
- a plurality of connection bumps disposed directly on a lower surface of each of the plurality of metal posts,
- wherein the plurality of redistribution vias include a first redistribution via connecting an uppermost redistribution pattern among the plurality of redistribution patterns to the first semiconductor chip, a second redistribution via connecting a lowermost redistribution pattern among the plurality of redistribution patterns to the plurality of metal posts, and a third redistribution via between the uppermost redistribution pattern and the lowermost redistribution pattern, and
- wherein a maximum width of the first redistribution via in a horizontal direction is greater than a maximum width of the third redistribution via in the horizontal direction.

* * * * *